(12) United States Patent
Levy

(10) Patent No.: US 7,043,709 B2
(45) Date of Patent: May 9, 2006

(54) METHOD AND APPARATUS FOR DETERMINING GATE-LEVEL DELAYS IN AN INTEGRATED CIRCUIT

(75) Inventor: Harold J. Levy, Los Gatos, CA (US)

(73) Assignee: Synopsys, Inc., Mountain View, CA (US)

( * ) Notice: Subject to any disclaimer, the term of this patent is extended or adjusted under 35 U.S.C. 154(b) by 317 days.

(21) Appl. No.: 10/639,085

(22) Filed: Aug. 11, 2003

(65) Prior Publication Data
US 2005/0039151 A1 Feb. 17, 2005

(51) Int. Cl.
*G06F 9/45* (2006.01)
*G06F 17/50* (2006.01)

(52) U.S. Cl. .................. 716/6; 716/4; 716/5; 703/14; 703/15; 703/16

(58) Field of Classification Search ............... 716/4–6, 716/9; 703/6, 19, 14–16; 370/229; 327/108, 327/112, 141; 315/174
See application file for complete search history.

(56) References Cited

U.S. PATENT DOCUMENTS

| | | | | |
|---|---|---|---|---|
| 5,402,042 | A * | 3/1995 | Madsen ...................... 315/174 |
| 5,841,672 | A * | 11/1998 | Spyrou et al. .................. 716/6 |
| 6,038,383 | A * | 3/2000 | Young et al. .................. 716/5 |
| 6,314,546 | B1 * | 11/2001 | Muddu ........................... 716/5 |
| 6,405,348 | B1 * | 6/2002 | Fallah-Tehrani et al. ....... 716/4 |
| 6,496,960 | B1 * | 12/2002 | Kashyap et al. ................ 716/4 |
| 6,510,404 | B1 * | 1/2003 | Kuriyama et al. .............. 703/6 |
| 6,629,289 | B1 * | 9/2003 | Yamamoto et al. .......... 714/815 |
| 6,654,938 | B1 * | 11/2003 | Kosugi ........................... 716/6 |
| 6,721,929 | B1 * | 4/2004 | Li et al. .......................... 716/6 |
| 6,769,100 | B1 * | 7/2004 | Acar et al. ...................... 716/4 |
| 6,876,210 | B1 * | 4/2005 | Shimazaki et al. .......... 324/750 |
| 2002/0156610 | A1 * | 10/2002 | Kuriyama et al. ............ 703/19 |
| 2003/0212538 | A1 * | 11/2003 | Lin et al. ...................... 703/14 |
| 2005/0117510 | A1 * | 6/2005 | Huang ........................ 370/229 |

OTHER PUBLICATIONS

Nikolaidis et al., "Delay and power estimation for a CMOS inverter driving RC interconnect loads", May-Jun. 3, 1998, Circuits and Systems, ISCAS '98. Proceedings of the 1998 IEEE International Symposium on, vol. 6, 31 pp.:368-371 vol. 6.*

(Continued)

*Primary Examiner*—A. M. Thompson
*Assistant Examiner*—Helen Rossoshek
(74) *Attorney, Agent, or Firm*—Park, Vaughan & Fleming LLP; Edward J. Grundler

(57) ABSTRACT

A system is provided for determining voltage at the output of a gate in an integrated circuit. The system locates a gate within the integrated circuit and looks up a set of output current waveforms as a function of time for different effective capacitances at the gate's output. The system applies each output current waveform to its corresponding effective capacitance to calculate a first set of output voltages and applies each output current waveform to a model of the net coupled to the output of the gate to calculate a second set of output voltages. For each time step in a series of time steps, the system selects an output current waveform for which a voltage in the first set of output voltage waveforms matches a voltage in the second set of output voltage waveforms. The system uses the selected output current waveform to determine the output voltage.

21 Claims, 3 Drawing Sheets

OTHER PUBLICATIONS

Jiang et al., "Estimation of maximum power supply noise for deep sub-micron designs", Aug. 10-12, 1998, Low Power Electronics and Design, Proceedings. International Symposium, pp.: 233-238.*

Chatzigeorgiou et al., "Modeling CMOS gates driving RC interconnect loads", Apr. 2001, Circuits and Systems II: Analog and Digital Signal Processing, IEEE Transactions on, vol. 48, Issue 4, pp.: 413-418.*

* cited by examiner

METHOD AND APPARATUS FOR DETERMINING GATE-LEVEL DELAYS IN AN INTEGRATED CIRCUIT

BACKGROUND

1. Field of the Invention

The present invention relates to the design of integrated circuits. More specifically, the present invention relates to a method and an apparatus for determining gate-level delays in an integrated circuit.

2. Related Art

The process of designing integrated circuits often involves determining gate-level delays within the integrated circuit. These gate-level delays provide the designer with needed timing information to determine if the circuit meets timing requirements at clocked devices within the integrated circuit.

Currently available gate-level delay calculators avoid time-consuming transistor simulation by using pre-characterized libraries of delay and slew data for each gate. This data is pre-characterized for various values of input slew and lumped output capacitance for each gate timing waveform.

When gates are connected to detailed wire models instead of lumped output capacitances, a driver-model is derived from the library data in order to elicit the transistor behavior with the detailed wire model load. A common driver model for this purpose is either a voltage ramp in series with a resistor, or equivalently, a current ramp in parallel with a resistor. The resistor in these models is conventionally referred to as the "drive resistor."

Refinements have been made to this type of model to account for complex aspects of transistor behavior, such as replacing the driver-model ramp with a more complicated time-domain waveform. Other approaches have tried multiple drive resistances and arbitrary dynamic impedances.

The problem with all of these approaches is a lack of sufficient generality; that is, they all assume some simplified behavioral model of the gate and work with a "best fit" to the actual behavior. In other words, each behavioral model includes some small set of parameters, which are set so that the transistor-level behavior is matched as closely as possible. The accuracy of these approaches depends explicitly on the choice of simplified behavior.

Unfortunately, as integrated circuit technology continues to advance to very deep submicron feature sizes, the transistor-level behavior can become very complicated, while at the same time faster circuit speeds require greater accuracy in delay calculations. Unfortunately, many existing approaches to calculating gate-level delay extend the behavioral complexity but do not offer guaranteed accuracy. Furthermore, as new transistor-level behaviors become increasingly more important, the behavioral complexity must be extended again and again. Consequently, as the number of model parameters grows so must the complexity of the characterization data.

Hence what is needed is a method and an apparatus for determining gate-level delays in an integrated circuit without the problems described above.

SUMMARY

One embodiment of the present invention provides a system for determining a voltage at the output of a gate in an integrated circuit. The system operates by first receiving a design for the integrated circuit. Next, the system locates a gate within the integrated circuit and looks up a set of output current waveforms for the gate assuming a given input slew. Each output current waveform specifies output current as a function of time for a different effective capacitance at the output of the gate. The system then applies each output current waveform to its corresponding effective capacitance to calculate a first set of output voltage waveforms. The system also applies each output current waveform to an RC(L) network to calculate a second set of voltage output waveforms. This RC(L) network models the RC(L) characteristics of a net coupled to the output of the gate. For each time step in a series of time steps, the system selects an output current waveform for which a voltage obtained by evaluating a corresponding waveform in the first set of output voltage waveforms at the current time step matches a voltage obtained by evaluating a corresponding waveform in the second set of output voltage waveforms at the current time step. The system applies the selected output current waveform to the RC(L) network to update a present voltage at the output of the gate.

In a variation of this embodiment, looking up an output current waveform may involve interpolating between a first output current waveform associated with a first input slew and a second output current waveform associated with a second input slew.

In a further variation, if the given time step does not fall on a defined point on selected current waveform, applying the selected current waveform at the current time step may involve interpolating between a first point on the output current waveform and a second point on the output current waveform to establish an output current at the current time step.

In a further variation, the system interpolates between a first current waveform associated with a first effective capacitance and a second current waveform associated with a second effective capacitance to obtain an intermediate current waveform associated with an intermediate effective capacitance. Interpolation can also be done by fitting a multi-dimensional surface through all of the library points. For example, interpolation between input slew S and output capacitance C could be done with a bilinear formula such as:

$$I = k_1 + k_2 * S + k_3 * C + k_4 * S * C$$

where I is the output current and $k_1$–$k_4$ are fitting parameters; these parameters are computed by forcing the above formula to go through the library points that surround the desired (S, C) interpolation points. This approach can also be extended to include time interpolation.

In a further variation, the system calculates a gate delay for the gate by determining how long it takes for the updated voltage at the output of the gate to reach a threshold voltage.

In a further variation, the system generates an output voltage waveform for the gate by assembling a series of present voltages associated with consecutive time steps.

In a further variation, the lookup structure containing the output current waveforms includes output current waveforms for different gates as a function of input slew and effective capacitance.

DETAILED DESCRIPTION

Figure 1:
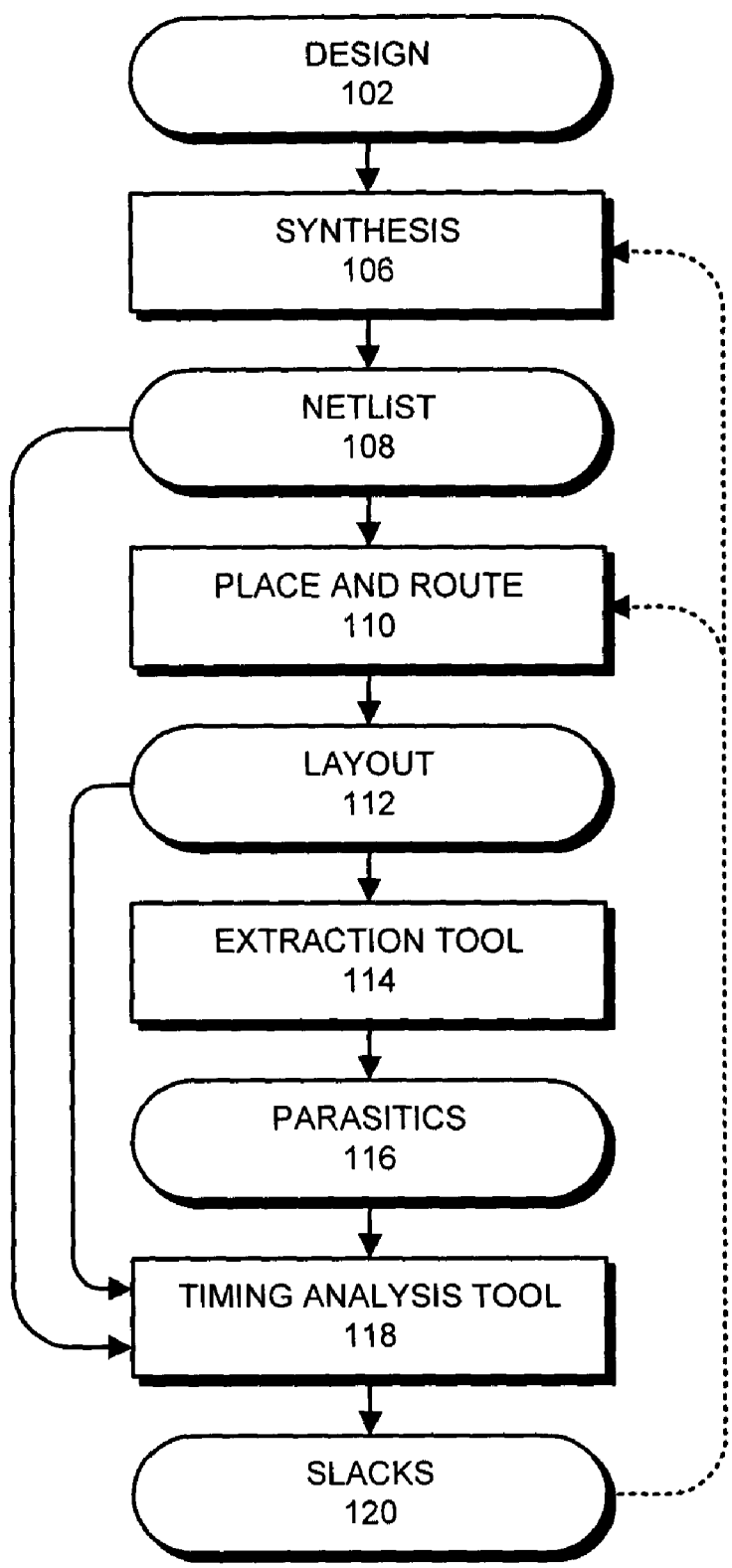
FIG. 1 illustrates a system for producing a layout of an integrated circuit in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Overview

This system takes an entirely different approach to driver modeling. The now approach is to not assume any particular behavioral model for the gate, but rather to provide a means to map arbitrary transistor-level behavior with lumped-capacitance loads to the transistor-level behavior with RC-network loads.

A major benefit of this approach is that it does not need to be extended as transistor behavior becomes more complicated in the future. Another major benefit is that no assumption is made about the behavior of the input waveform to the gate, so that this method may be used to propagate complex waveforms resulting from analysis of crosstalk, noise, inductance, etc.

This system as applied to a specific timing waveform through a specific gate is comprised of these key ideas:

(1) For a specific time-dependent input voltage waveform ($V_{inp}(t)$), use transistor-level simulation to sample the time-dependent output current for a set of lumped output capacitances; for each output capacitance value, there is one output current waveform ($I_c(t)$). For each specific $V_{inp}(t)$ there is a set of $I_c(t)$'s, $\{I_c(t)\}$. Note that these currents correspond to some fixed operating condition (e.g. temperature, manufacturing process, input voltage swing, etc.). These currents can be scaled by some method to account for other operating conditions.

(2) In order to support a range of time-dependent input voltage waveforms, the characterization in (1) will be conducted for a set of $V_{inp}(t)$'s, $\{V_{inp}(t)\}$. Hence, the total data measured will be a set of $\{(I_c(t)\}$'s, $\{\{I_c(t)\}\}$. For a specific $V_{inp}(t)$ not explicitly in $\{V_{inp}(t)\}$, it is assumed that some interpolation methodology can be applied to generate a valid $\{V_{inp}(t)\}$. Note that if transistor-level behavior becomes more sensitive to the nuances in $V_{inp}(t)$, the idea of this system does not change, only the set of $\{V_{inp}(t)\}$ and/or the interpolation methodology needs to change. Note also that the $V_{inp}(t)$ to be used can be a piecewise reference to the $V_{inp}(t)$ used in pre-characterization. For example, if all the $\{V_{inp}(t)\}$ are linear, then an arbitrary $V_{inp}(t)$ could be resolved and used with this process as a piecewise linear waveform.

(3) The calculation to be addressed, therefore, is for a specific $\{(I_c(t)\}$ and a specific RC-network. The system calculates the time-dependent output voltage waveforms, ($V_{out}(t)$) at any of the nodes in the RC(L) network. For the purposes of this discussion, the discussion will focus on $V_{out}(t)$ at the driven node (i.e. the node to which the output pin of the gate is connected). While this description assumes single-drive, this process can be applied to multi-driven networks as well. This is accomplished in a time-stepping manner as follows for each timestep:

(a) Apply $\{(I_c(t)\}$ to the set of capacitances $\{c\}$ used in the transistor level simulation to obtain the set of output voltages $\{V_c(t)\}$. There will be one $V_c(t)$ for each capacitance.

(b) Apply each $I_c(t)$ in the set to the RC-network; there will be a resulting set of output voltage $\{V_n(t)\}$.

(c) For the current time-step at time t, the $V_n(t)$ for the timestep is chosen where the sets $\{V_c(t)\}$ and $\{V_n(t)\}$ intersect. This is done by some interpolation methodology. Note that if transistor-level behavior becomes more sensitive to the nuances of $I_c(t)$, the idea of this system does not change, only the set of $\{(I_c(t)\}$ and/or the interpolation methodology does.

(d) For the current time-step at time t, use the selected $I_c(t)$ from step (c) to update $V_n(t)$.

(e) Go to step (a) until the desired portion of $V_n(t)$ is reached.

Note that in the above discussion, the time t is advanced independently of the sample times used to construct $\{\{(I_c(t)\}\}$. Also note that many different types of interpolation are implied:

(1) Interpolation between different $\{(I_c(t)\}$'s for different $V_{inp}(t)$'s. Interpolation between $I_c(t_1)$ and $I_c(t_2)$, where $t_1 \leq t \leq t_2$.

(2) Interpolation between $I_{c1}(t)$ and $I_{c2}(t)$ to find the $I_c(t)$ that would have elicited $V_{out}(t)=V_n(t)$.

No assumptions about the type of interpolation have been made (i.e. linear or nonlinear), though certainly a "better" method will require fewer characterization points to deliver equivalent accuracy.

Lastly, note that in (3a), (3b), and (3d), where voltages are updated according to specific applied currents, that an implied methodology is used to integrate the differential equation(s) describing the circuit. The accuracy of this system is best when the same method is used in (3a), (3b), and (3d) as is used in (1) and (2).

Gate-Level Delay Calculating System

FIG. 1 illustrates a system for producing a layout of an integrated circuit in accordance with an embodiment of the present invention. The system first receives a design 102 for an integrated circuit from a designer (not shown).

Synthesis module 106 creates netlist 108 for the integrated circuit. Netlist 108 provides the input to place and route module 110. Place and route module 110 uses netlist 108 to create a layout 112 for the integrated circuit.

Extraction tool 114 uses layout 112 to extract the RC(L) parasitics 116 for each net within layout 112. Timing analysis tool 118 processes parasitics 116 to calculate slacks 120 for each net within the integrated circuit. If any of the slacks are negative, the system can provide feedback to any of the preceding stages such as synthesis module 106 and place and route module 110 to adjust parameters that change the gate-level delays. This feedback can include using larger drivers, adding buffers, and the like. Netlist 108 and layout 112 also provide input to timing analysis tool 118. Timing analysis tool 118 is discussed in detail in conjunction with FIG. 2 below.

Timing Analysis Tool

Figure 2:
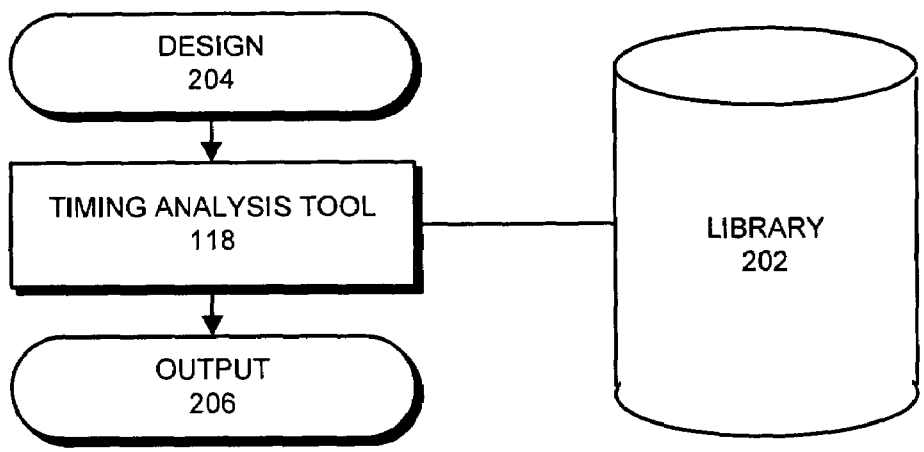
FIG. 2 illustrates a timing analysis tool in accordance with an embodiment of the present invention.

FIG. 2 illustrates a timing analysis tool 118 in accordance with an embodiment of the present invention. Timing analysis tool 118 receives design 204 from the system and provides output 206 to the system. Design 204 includes netlist 108, layout 112, and parasitics 116. Note that timing analysis tool 118 is coupled to library 202 to access output current waveforms for the various gates within the integrated circuit.

During operation, the system receives design 204 and selects gates from design 204 for calculating gate-level delays. Note that the system iterates over design 204 to select each gate within design 204 for processing. During this process, the gate-level delay for each gate in the integrated circuit is calculated.

Timing analysis tool 118 interacts with library 202 to retrieve output current waveforms for the gates within the integrated circuit. Library 202 includes output current waveforms for each gate type and size within the integrated circuit. Each output current waveform specifies the output current for the gate as a function of time and a given input slew.

Timing analysis tool 118 integrates the current waveform over time when the current waveform is used as an input to a given output capacitance or to a given RC(L) network to calculate the output voltage as a function of time. These output voltages are used to calculate the gate-level delays as is described below.

Timing analysis tool 118 interpolates between waveforms as needed. More specifically, timing analysis tool 118 can interpolate in time, in output capacitance, and in input slew. The interpolation can be linear or non-linear as needed to provide the most accurate results.

Timing analysis tool 118 compares the output voltage across an output capacitance and across the given RC(L) network at discrete time steps in order to select the appropriate output capacitance at each time step.

Timing analysis tool 118 also calculates the gate-level delays between the input slew and the output waveform by using a comparison of the output voltages at discrete time steps.

Gate Driving a Net

Figure 3:
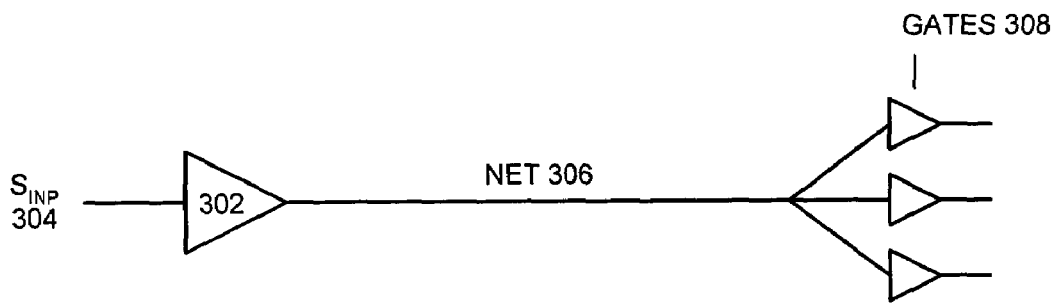
FIG. 3 illustrates a gate driving a net in accordance with an embodiment of the present invention.

FIG. 3 illustrates a gate driving a net in accordance with an embodiment of the present invention. Gate 302 can be any arbitrary gate or driver driving a net 306 within the integrated circuit. Net 306 can include a fan out into gates 308 as shown. Net 306 includes distributed resistance, capacitance, and inductance, which affect the signal propagation and delay characteristics of net 306. Slew input $S_{INP}$ 304 is an input into gate 302 that is used in calculating the gate-level delays of the gate and the net. $S_{INP}$ 304 can be selected to represent an expected input to gate 302.

Current Waveforms

Figure 4:
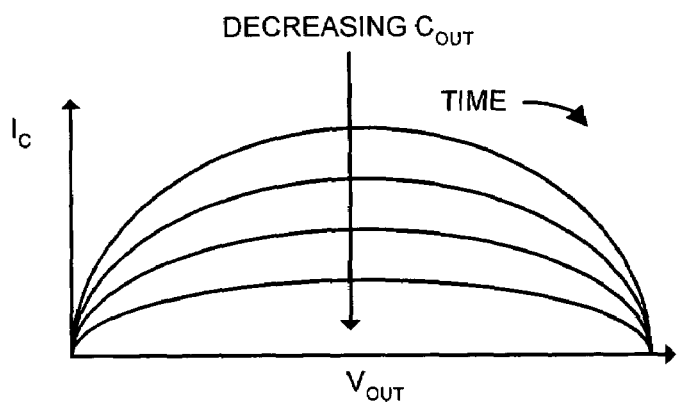
FIG. 4 illustrates current waveforms in accordance with an embodiment of the present invention.

FIG. 4 illustrates current waveforms in accordance with an embodiment of the present invention. Each current waveform provides the current into the capacitor as a function of the output voltage when $S_{INP}$ 304 is applied to the capacitor. Note that as the capacitance decreases, the current at a given output voltage also decreases.

Calculating Gate-Level Delays

Figure 5:
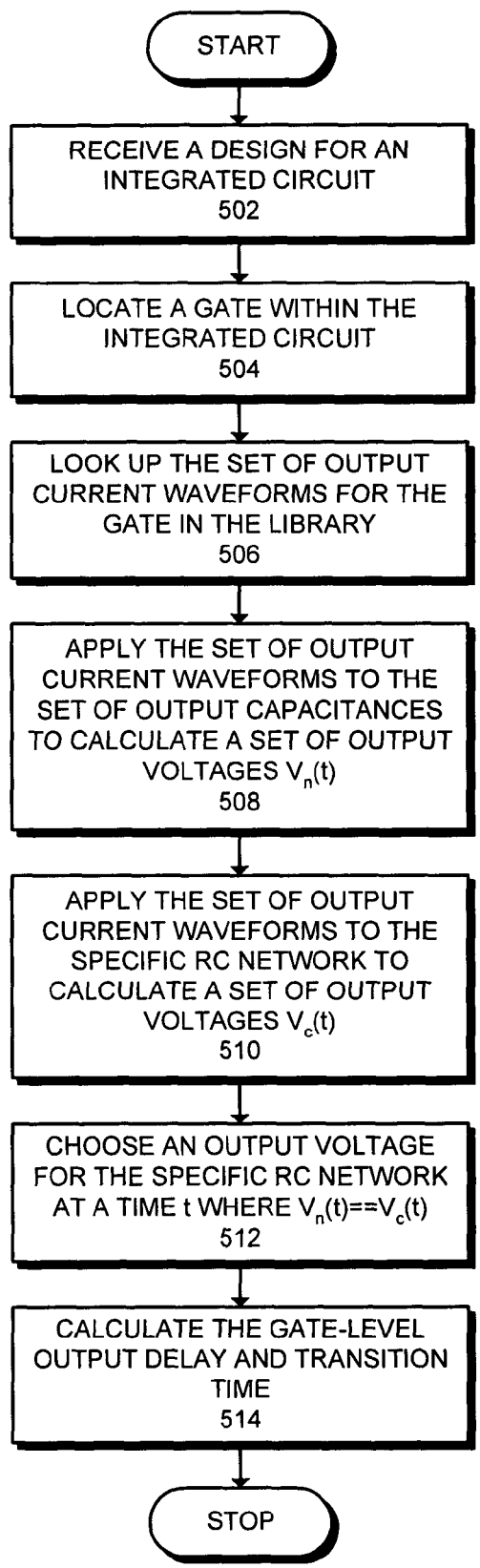
FIG. 5 presents a flowchart illustrating the process of calculating gate-level delays and transition times in accordance with an embodiment of the present invention.

FIG. 5 presents a flowchart illustrating the process of calculating gate-level delays in accordance with an embodiment of the present invention. The system starts when a design for an integrated circuit is received (step 502). Next, the system locates a gate within the integrated circuit (step 504). The system then looks up a set of output current waveforms for the gate in the library assuming a given input slew (step 506).

The system applies each output current waveform to its corresponding effective output capacitance to calculate a set of output voltages (step 508). The system also applies each output current waveform to the specific RC(L) network to calculate a set of output voltages (step 510). The system chooses an output voltage for the specified RC(L) network at a time t where $V_c(t)=V_n(t)$ (step 512). Finally, the system calculates the gate-level delay time and/or the transition time between two output voltage thresholds bet (step 514). Additionally, the system can save a subset of the output voltage waveform points for use in driving downstream gates.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining a voltage at the output of a gate in an integrated circuit, comprising:

receiving a design for the integrated circuit;

locating a gate within the integrated circuit; and looking up in a library a set of output current waveforms for the gate assuming a given input slew, wherein each output current waveform specifies output current as a function of time for a different effective capacitance at the output of the gate;

applying each output current waveform to its corresponding effective capacitance to calculate a first set of voltage waveforms voltages;

applying each output current waveform to a given RC(L) network to calculate a second set of voltage waveforms voltages, wherein the given RC(L) network models RC(L) characteristics of a net coupled to the output of the gate; and for each time step in a series of time steps, selecting an output current waveform for which a voltage obtained by evaluating a corresponding waveform in the first set of voltage waveforms voltages at the current time step matches a voltage obtained by evaluating a corresponding waveform in the second set of voltage waveforms voltages at the current time step, and applying the selected output current waveform to the given RC(L) network to update a present voltage at the output of the gate.

2. The method of claim 1, wherein looking up an output current waveform may involve interpolating between a first output current waveform associated with a first input slew and a second output current waveform associated with a second input slew.

3. The method of claim 1, wherein if the given time step does not fall on a defined point on selected current waveform, applying the selected current waveform at the current time step may involve interpolating between a first point on the output current waveform and a second point on the output current waveform to establish an output current at the current time step.

4. The method of claim 1, further comprising interpolating between known points of parameters associated with the gate and output current waveforms, wherein interpolating can include multi-dimensional interpolation.

5. The method of claim 1, further comprising calculating an output parameter for the gate, wherein the output parameter can include on of a delay and a transition-time.

6. The method of claim 1, further comprising generating an output voltage waveform for the gate by assembling a series of present voltages associated with consecutive time steps.

7. The method of claim 1, wherein a lookup structure containing the output current waveforms includes output current waveforms for different gates as a function of input slew and effective capacitance.

8. A computer-readable storage medium storing instructions that when executed by a computer cause the computer to perform a method for determining a voltage at the output of a gate in an integrated circuit, the method comprising:
receiving a design for the integrated circuit;
locating a gate within the integrated circuit; and
looking up in a library a set of output current waveforms for the gate assuming a given input slew, wherein each output current waveform specifies output current as a function of time for a different effective capacitance at the output of the gate;
applying each output current waveform to its corresponding effective capacitance to calculate a first set of voltage waveforms voltages;
applying each output current waveform to a given RC(L) network to calculate a second set of voltage waveforms voltages, wherein the given RC(L) network models RC(L) characteristics of a net coupled to the output of the gate; and
for each time step in a series of time steps,
selecting an output current waveform for which a voltage obtained by evaluating a corresponding waveform in the first set of voltage waveforms voltages at the current time step matches a voltage obtained by evaluating a corresponding waveform in the second set of voltage waveforms voltages at the current time step, and
applying the selected output current waveform to the given RC(L) network to update a present voltage at the output of the gate.

9. The computer-readable storage medium of claim 8, wherein looking up an output current waveform may involve interpolating between a first output current waveform associated with a first input slew and a second output current waveform associated with a second input slew.

10. The computer-readable storage medium of claim 8, wherein if the given time step does not fall on a defined point on selected current waveform, applying the selected current waveform at the current time step may involve interpolating between a first point on the output current waveform and a second point on the output current waveform to establish an output current at the current time step.

11. The computer-readable storage medium of claim 8, the method further comprising interpolating between known points of parameters associated with the gate and output current waveforms, wherein interpolating can include multi-dimensional interpolation.

12. The computer-readable storage medium of claim 8, the method further comprising calculating an output parameter for the gate, wherein the output parameter can include on of a delay and a transition-time.

13. The computer-readable storage medium of claim 12, the method further comprising generating an output voltage waveform for the gate by assembling a series of present voltages associated with consecutive time steps.

14. The computer-readable storage medium of claim 8, wherein a lookup structure containing the output current waveforms includes output current waveforms for different gates as a function of input slew and effective capacitance.

15. An apparatus for determining a voltage at the output of a gate in an integrated circuit, comprising:
a timing analysis tool configured to receive a design for the integrated circuit;
wherein the timing analysis tool is further configured to locate a gate within the integrated circuit;
wherein the timing analysis tool is further configured to look up in a library a set of output current waveforms for the gate assuming a given input slew, wherein each output current waveform specifies output current as a function of time for a different effective capacitance at the output of the gate;
wherein the timing analysis tool is further configured to apply each output current waveform to its corresponding effective capacitance to calculate a first set of output voltage waveforms;
wherein the timing analysis tool is further configured to apply each output current waveform to a given RC(L) network to calculate a second set of voltage output waveforms, wherein the given RC(L) network models RC(L) characteristics of a net coupled to the output of the gate;
wherein the timing analysis tool is further configured to select an output current waveform for which a voltage obtained by evaluating a corresponding waveform in the first set of output voltage waveforms at the current time step matches a voltage obtained by evaluating a corresponding waveform in the second set of output voltage waveforms at the current time step for each time step in a series of time steps; and
wherein the timing analysis tool is further configured to apply the selected output current waveform to the given RC(L) network to update a present voltage at the output of the gate.

16. The apparatus of claim 15, wherein looking up an output current waveform may involve interpolating between a first output current waveform associated with a first input slew and a second output current waveform associated with a second input slew.

17. The apparatus of claim 15, wherein if the given time step does not fall on a defined point on selected current waveform, applying the selected current waveform at the current time step may involve interpolating between a first point on the output current waveform and a second point on the output current waveform to establish an output current at the current time step.

18. The apparatus of claim 15, wherein the timing analysis tool is further configured to interpolate between known points of parameters associated with the gate and output current waveforms, wherein interpolating can include multi-dimensional interpolation.

19. The apparatus of claim 15, wherein the timing analysis tool is further configured to calculate an output parameter for the gate, wherein the output parameter can include on of a delay and a transition-time.

20. The apparatus of claim 19, wherein the timing analysis tool is further configured to generate an output voltage waveform for the gate by assembling a series of present voltages associated with consecutive time steps.

21. The apparatus of claim 15, wherein a lookup structure containing the output current waveforms includes output current waveforms for different gates as a function of input slew and effective capacitance.

* * * * *

UNITED STATES PATENT AND TRADEMARK OFFICE
CERTIFICATE OF CORRECTION

| | |
|---|---|
| PATENT NO. | : 7,043,709 B2 |
| APPLICATION NO. | : 10/639085 |
| DATED | : May 9, 2006 |
| INVENTOR(S) | : Harold J. Levy |

It is certified that error appears in the above-identified patent and that said Letters Patent is hereby corrected as shown below:

In claim 1 (at column 6, line 51), please delete the phrase, "voltage waveforms voltages" and replace with the phrase --voltage waveforms--.

In claim 1 (at column 6, line 54), please delete the word, "voltages".

In claim 1 (at column 6, line 64), please insert the word, --output-- after set of.

In claim 1 (at column 6, line 64), please delete the phrase, "voltage waveforms voltages" and replace with the phrase --voltage waveforms--.

In claim 5 (at column 7, line 19), please delete the word, "on" and replace with the word --one--.

In claim 8 (at column 7, line 41), please delete the phrase, "voltage waveforms voltages" and replace with the phrase --voltage waveforms--.

In claim 8 (at column 7, line 44), please delete the word, "voltages".

In claim 8 (at column 7, line 50), please insert the word, --output-- after set of.

In claim 8 (at column 6, line 64), please delete the phrase, "voltage waveforms voltages" and replace with the phrase --voltage waveforms--.

In claim 12 (at column 8, line 11), please delete the word, "on" and replace with the word --one--.

UNITED STATES PATENT AND TRADEMARK OFFICE
CERTIFICATE OF CORRECTION

PATENT NO. : 7,043,709 B2
APPLICATION NO. : 10/639085
DATED : May 9, 2006
INVENTOR(S) : Harold J. Levy It is certified that error appears in the above-identified patent and that said Letters Patent is hereby corrected as shown below:

In claim 19 (at column 9, line 6), please delete the word, "on" and replace with the word --one--.

Signed and Sealed this

Seventeenth Day of October, 2006

JON W. DUDAS
*Director of the United States Patent and Trademark Office*